US006686102B2

United States Patent
Randall et al.

(10) Patent No.: US 6,686,102 B2
(45) Date of Patent: Feb. 3, 2004

(54) TWO-EXPOSURE PHASE SHIFT PHOTOLITHOGRAPHY WITH IMPROVED INTER-FEATURE SEPARATION

(75) Inventors: John N. Randall, Richardson, TX (US); Gene E. Fuller, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/305,002

(22) Filed: Nov. 27, 2002

(65) Prior Publication Data

US 2003/0077526 A1 Apr. 24, 2003

Related U.S. Application Data

(62) Division of application No. 09/728,133, filed on Nov. 30, 2000, now abandoned.
(60) Provisional application No. 60/172,196, filed on Dec. 17, 1999.

(51) Int. Cl.$^7$ .................................................. G03F 9/00
(52) U.S. Cl. ......................... 430/5; 430/322; 430/323; 430/394; 430/396
(58) Field of Search ........................... 430/5, 394, 396, 430/322, 323

(56) References Cited

U.S. PATENT DOCUMENTS

| 5,045,417 A | 9/1991 | Okamoto ........................ 430/5 |
| 5,573,890 A | 11/1996 | Spence ........................ 430/311 |
| 5,759,744 A | 6/1998 | Brueck et al. ................. 430/312 |
| 5,817,438 A | 10/1998 | Chen et al. ..................... 430/5 |
| 5,858,580 A | 1/1999 | Wang et al. ..................... 430/5 |

OTHER PUBLICATIONS

H–Y Liu et al. "The Application of Altyernating Phase Shit Masks to 140nm Gate Patterning (II)". □□□SPIE, v3334 (1998), p. 2–14.*
The Application of Alternating Phase Shifting Masks to 140nm Gate Patterning ( II): Mask Design and Manufacturing Tolerances. Hua–Yu Liu, Linard Karklin, Yao–Ting Wang and Y.C.Pati: Proc.SPIE, V3334,(1998), pp2–14.

* cited by examiner

Primary Examiner—Mark F. Huff
Assistant Examiner—Kripa Sagar
(74) Attorney, Agent, or Firm—Jacqueline J. Garner; Wade James Brady, III; Frederick J. Telecky, Jr.

(57) ABSTRACT

A method of double-exposure photolithography of a semiconductor wafer in the manufacture of integrated circuits is disclosed. The two exposures of the same positive photoresist layer are carried out using a binary photomask (25) having chrome regions (22) that define non-critical dimension features (6c) and also serve as protection for phase shift exposure of critical dimension features (6g). The phase shift photomask (23) includes apertures $20_0$, $20_\pi$ that expose the sides of the critical dimension feature (6g) with opposite phase light. The phase shift photomask (23) also includes an additional aperture (30) for double exposure of a region exposed by the binary photomask, for example as between a non-critical dimension feature (6c) and the end of a critical dimension feature (6g). According to another disclosed feature, orthogonal overlapping chrome regions (34, 36), each of critical dimension width ($w_{34}$, $w_{36}$), are provided on the binary and phase shift photomasks (35, 33), to define a feature by way of their intersection.

8 Claims, 8 Drawing Sheets

TWO-EXPOSURE PHASE SHIFT PHOTOLITHOGRAPHY WITH IMPROVED INTER-FEATURE SEPARATION

CROSS-REFERENCE TO RELATED APPLICATIONS

This application is a division of Ser. No. 09/728,133 filed Nov. 30, 2000, now abandoned which claims priority from provisional application Ser. No. 60/172,196 filed Dec. 17, 1999.

STATEMENT REGARDING FEDERALLY SPONSORED RESEARCH OR DEVELOPMENT

BACKGROUND OF THE INVENTION

This invention is in the field of integrated circuit manufacturing, and is more specifically directed to photolithography processes in such manufacturing. As is fundamental in the field of integrated circuit electronics, the functional capability of an integrated circuit depends substantially upon the number of active components (transistors, resistors, capacitors, etc.) that can be physically realized per unit area of the integrated circuit. It is therefore desirable to fabricate device features that are as small as possible, and as closely packed as possible, to provide not only a high level of functionality for the integrated circuit, but also a high level of circuit performance due to such small feature sizes. For example, many modern integrated circuit devices are fabricated with lateral features that are below one-half micron in width, realizing as many as tens of millions of transistors in a single integrated circuit operating at clock frequencies greater than 100 MHz. It is contemplated that these trends toward smaller and faster devices will continue, to the extent permitted by the state of the art of the manufacturing technology.

Conventional integrated circuit manufacturing technology utilizes photolithography for defining the location and dimensions of lateral features in the integrated circuit. As is fundamental in the art, photolithography is generally carried out by the application of a photosensitive substance, referred to as photoresist, over the film to be patterned. Selective exposure of the photoresist to electromagnetic energy (i.e., light) defines the portions of the film that are to be removed by the developing process, and those locations that are to remain. For purposes of manufacturing efficiency, the photoresist over the full area of one or more of the integrated circuits on the wafer are simultaneously exposed through photomasks, with transparent and opaque regions of the photomasks defining the locations of the photoresist that are exposed or not exposed, respectively. As a result of developing, photoresist is removed from the surface of the wafer, with the remaining regions of the photoresist (as defined by the selective exposure) serving as a mask to the etch of the underlying film, thus defining the features of the integrated circuit. Such masking may also be used in connection with other processes, such as ion implantation. Once the etch is completed, the remaining photoresist mask is then removed from the wafer. The processing of the wafer continues, with deposition of the next film layer and, if desired, photolithographic patterning and etching of this next layer.

According to modern conventional technology, the photomasks are generally in the form of reticles, where the images on the photomask itself are of some multiple magnitude (e.g., 4X) of the feature size to be patterned on the wafer. Exposure of the wafer through the reticle is carried out in combination with a focusing lens system disposed between the reticle and the wafer, so that the patterned exposure is reduced from that on the reticle. Reticles are generally used in connection with stepper exposure systems, in which only one or a few integrated circuit die are exposed at a time; the wafer is then indexed, or "stepped", to the next position for photo-exposure through the reticle. The larger feature sizes on the reticles, relative to the integrated circuit feature sizes, facilitates the fabrication of the reticles themselves by way of photolithography. Of course, the photomasks may alternatively be so-called 1xphotomasks that are placed in proximity to the wafer being patterned. For purposes of this description the term photomask will refer both to 1xphotomasks and also to reticles, of both the full wafer and stepper type.

Certain "critical dimension" features in the integrated circuit, such as transistor gate electrodes, contact aperture sizes, and conductor widths and the like, relate directly to the density and performance of the integrated circuit. Typically, minimum width transistor gate electrodes are the most critical features in the integrated circuit layout, given the prevalence of transistors in the integrated circuit and also considering that gate electrode width relates directly to transistor channel length and thus to the gain and switching speed of the device. As such, the ability to reliably define and construct ever-smaller features such as transistor gates is of high importance in the field of integrated circuit design and manufacture.

As noted above, critical dimension features of modern integrated circuits are now on the order of one-half micron or less. Such sub-micron critical dimensions are on the order of the wavelength of the light energy used in the exposure. At these dimensions, the minimum feature size that may be imaged, at a usable depth of focus, depends strongly upon the wavelength of light used; so-called "deep UV" light is currently used to effect the higher resolution imaging required for modern integrated circuits. In modern photolithography processes, the minimum feature size that may be imaged by a photomask is approximately $$0.5\frac{\lambda}{NA},$$

where $\lambda$ is the wavelength of the exposing light and NA is the numerical aperture of the lens system of the stepper. The proportionality constant of this resolution ratio (in this example, having the value 0.5) is commonly referred to in the art as $k_1$; a similar relationship is provided for depth of focus (having a proportionality constant $k_2$). While a large numerical aperture permits the patterning of extremely small features, the depth of focus of the lens system decreases with increasing NA values. Considering the realistic extent to which the topography of the wafer can be made flat during its manufacture, which in turn limits the numerical aperture of the lens system, the minimum feature size that can be patterned by photolithography at a given wavelength reaches a practical limit.

Certain techniques for further reduction in the feature size that may be imaged for a given wavelength are also known in the art. One known technique uses a phase-shift photomask in which adjacent or nearby openings, or apertures, transmit light at opposing phases (i.e., 0° and 180°). As known in the art, light passing through a mask aperture of a size on the same order as the wavelength of the light will be locally coherent. The phase of this locally coherent light depends upon the thickness of the transparent material through which the light passes; as such, phase shift photomask apertures have varying thicknesses relative to one another, to establish the phase shift relationship. The phase shift effect may be used to define extremely small features on the wafer by placing opposite phase apertures on opposite sides of the small feature to be defined. To the extent that diffracted light reaches the photoresist at the location of the feature from both of the opposite phase apertures, the opposing phases will tend to cancel one another. As a result, unintended exposure of critical feature locations is greatly reduced, permitting the formation of these features.

Examples of conventional phase-shift photolithography are described in U.S. Pat. No. 5,045,417, U.S. Pat. No. 5,573,980, and U.S. Pat. No. 5,858,580.

In particular, one conventional approach utilizes two masks in the photolithographic patterning of critical dimension features, such as polysilicon gate electrodes in integrated circuits. While the use of two photomasks, and thus two exposure steps, is of course cumbersome in the manufacture of integrated circuits, the incorporation of phase-shift masking for critical dimension features along with conventional masking for the non-critical dimension features, into a single photomask, has been found to be extremely difficult, and unsuitable for automated mask generation. The above-noted U.S. Pat. No. 5,858,580 describes a known two-photomask photolithographic process. According to this technique, one photomask, referred to as the "phase shift" mask, defines the critical dimension features through the use of adjacent phase-shift apertures therethrough. These critical dimension features, in the case of the polysilicon gate level, are typically located over "active" regions of the integrated circuit wafer, so that the patterned gate electrodes thereat serve as transistor gates. The other photomask, referred to as the "binary" mask, defines features of the level that are not critical dimension, and that do not require phase-shift masking; as such, the binary mask does not include phase-shift apertures. The binary mask also masks the phase-shift-exposed locations of the wafer, so as not to interfere with the phase-shift exposure of the critical dimension features. According to this technique, photolithography is carried out by exposing the wafer first through either the binary mask or the phase shift mask, and then (before developing the photoresist) again exposing the wafer through the other of the paired masks. As a result, the critical features are formed by way of phase-shift masking, while easing the generation of the photomasks themselves so as to comply with the design rules of the integrated circuit.

It has been observed, in connection with the present invention, that certain difficulties are present in the fabrication of integrated circuits using the two-photomask method, such as described by way of example in the above-noted U.S. Pat. No. 5,858,580. These difficulties will now be described relative to FIGS. 1a through 1f. FIGS. 1a and 1b illustrate, in plan and cross-sectional views, respectively, an exemplary structure to be formed at the polysilicon gate level in an integrated circuit, relative to which difficulties faced with conventional phase-shift photolithography will be described with reference to FIGS. 1c through 1g. This structure is formed at a surface of silicon substrate 2 at which field oxide structure 8 is present, adjacent to active region 4 at which transistors will be formed. As is well-known in the art, active region 4 is defined by those locations of the surface of substrate 2 at which field oxide 8 is not present, such that field oxide 8 serves as an isolation structure. Polysilicon gate electrode 6g and polysilicon conductor 6c are formed from the same deposited polysilicon layer, patterned by way of phase-shift photolithography as will be described below. Gate electrode 6g is of course disposed over active region 4 (separated therefrom by gate dielectric 7, in the conventional manner), and slightly overlaps onto field oxide 8; in this way, in operation, voltage applied to gate electrode 6g will control conduction between the opposing sides of active region 4 (which will be doped to form the transistor source and drain). Conductor 6c, in this location of the integrated circuit, is disposed on field oxide 8, and serves as a signal conductor. According to this example, gate electrode 6g is a critical dimension feature, meaning that it is to be formed to have a very narrow (e.g., on the order of $0.15\mu$) width so as to provide a high performance transistor. Conductor 6c, on the other hand, is formed of a non-critical width (e.g., 0.5% or greater).

FIGS. 1c and 1e illustrate portions of a pair of photomasks 13, 15 used to pattern gate electrode 6g and conductor 6c according to a conventional technique, similar to that described in the above-noted U.S. Pat. No. 5,858,580, for the case where positive photoresist is used (i.e., exposed photoresist is to be removed in developing). As noted above, photomasks 13, 15 may either be reticles, or 1×photomasks. Typically, however, in modern photolithography of submicron features such as in this example, photomasks 13, 15 will be reticles.

Phase shift photomask 13, illustrated in FIG. 1c, utilizes the phase-shift technique noted above to pattern critical dimension gate electrode 6g. As shown in FIG. 1c, phase shift photomask 13 includes apertures $10_0$, $10_\pi$, which are disposed on opposite sides of the location at which gate electrode 6g is to be formed. Apertures $10_0$, $10_\pi$ are constructed so that they transmit light of opposite phase relative to one another.

FIG. 1d illustrates, in cross-section, the portion of phase shift photomask 13 that includes apertures $10_0$, $10_\pi$. Phase shift photomask 13 includes quartz substrate 11, upon which chrome film 9 defines the location of apertures therethrough, such as apertures $10_0$, $10_\pi$. According to this conventional approach, apertures $10_0$, $10_\pi$ are realized not only by the absence of chrome film 9, but also by the depth to which a recess or trench is etched into quartz substrate 5 thereat. In this example, aperture $10_\pi$ is formed by a recess etched into quartz substrate 11, while aperture $10_0$ is simply an opening in chrome film 9. The depth of the recess of aperture $10_\pi$ is selected so that the remaining relative thicknesses to, $t_\pi$ of substrate 11 at apertures $10_0$, $10_\pi$, respectively, correspond to the desired relative phase of light passing therethrough (considering the transmitted light to be locally coherent, as noted above). These thicknesses t0, $t_\pi$ depend upon the wavelength of the light to be used in the exposure, as is known in the art. In this case, the light transmitted by aperture $10_\pi$ will have a 180° ($\pi$ radians) phase shift relative to the light transmitted by aperture $10_0$.

Referring back to FIG. 1c, phase shift photomask 13 does not expose photoresist at any other locations than at the critical-dimension locations, according to this conventional approach. In particular, it is apparent from a comparison of FIG. 1a to FIG. 1c that phase shift photomask 13 does not expose the region between gate electrode 6g and conductor 6c, nor does it expose much of active region 4 on either side of gate electrode 6g. As such, phase shift photomask 13 is typically referred to as a "dark field" mask. According to conventional two-mask phase shift photolithography, phase shift photomasks such as photomask 13 do not have apertures that are not directly over active regions, such as active region 4.

Binary photomask 15 exposes photoresist regions at the non-critical dimension locations of the integrated circuit, as evident from FIG. 1e. In this example, binary photomask 15 includes chrome regions 12g, 12c that mask exposure at the locations of gate electrode 6g and conductor 6c; photomask 15 is transparent at the other regions, and as such is commonly referred to as a "bright field" or "light field" photomask. Chrome region 12g operates as substantially a gate protective mask, and is not formed to the critical dimension; rather, chrome region 12g simply protects the region of photoresist that has been, or will be, exposed through photomask 13 from additional exposure, relying on phase shift photomask 13 to define gate electrode 6g. Chrome region 12g does, however, define the end of gate electrode 6g that extends toward conductor 6c, considering that adjacent 0° and 180° phase shift apertures could not so define an exposed region (because of the phase cancellation effects). Chrome region 12c defines conductor 6c, as this feature is not of critical dimension.

In the manufacture of the structure of FIGS. 1a and 1b, as is well known in the art, a photoresist layer (positive resist, in this example) is dispensed over the previously deposited polysilicon layer from which gate electrode 6g and conductor 6c are to be formed. The wafer and photoresist will then be sequentially exposed to light of the desired wavelength (e.g., ultraviolet) through photomasks 13, 15. As described in the above-noted U.S. Pat. No. 5,858,580, the order in which photomasks 13, 15 are used is not important. Following this second exposure, the photoresist layer is developed, with the locations of photoresist that were exposed through photomasks 13, 15 being removed, and the unexposed regions remaining to serve as a mask for etch of the polysilicon. A common problem encountered in photolithography is the presence of low contrast regions of the pattern, such as between gate electrode 6g and conductor 6c in this example, at which bridging of the etched polysilicon may result. FIG. 1f illustrates the results of a simulation of the magnitude of light exposure for the case of double exposure through photomasks 13, 15, as described hereinabove. In this particular example, the critical dimension width of gate electrode 6g is approximately $0.16\mu$, and the space between the end of gate electrode 6g and conductor 6c is approximately $0.12\mu$, as evident from FIG. 1f.

FIG. 1f illustrates that the central location at which gate electrode 6g is to be formed receives no light exposure, nor does the location of conductor 6c (the no exposure regions represented by the cross-hatching). Locations on either side of the location of gate electrode 6g receive full exposure (indicated by the absence of hatching). FIG. 1f also includes contour lines, each representative of locations receiving common exposure levels, and each corresponding to a 10% step from full exposure to no exposure. As evident from FIG. 1f, the region between the end of gate electrode 6g and conductor 6c does not receive full exposure as it ought to (polysilicon is to be etched from this location, as shown in FIG. 1a); rather, this region receives on the order of 60% of full exposure. This reduced exposure is due to the small spacing between chrome regions 12c, 12g of binary photomask 15. Because of this reduced exposure, some amount of photoresist may remain at this location after exposure and developing, particularly considering such factors as photoresist thickness and topography due to field oxide structure 8 at this location. As a result, the etch of polysilicon between gate electrode 6g and conductor 6c may be incomplete, causing bridging and shorting between these two elements. Because conventional double photomask phase shift lithography has been concerned with the definition of critical dimension features such as gate electrode 6g, this conventional approach does not provide relief for this problem.

By way of further background, phase shift masks having opposite and intermediate phase regions are also known in the art. FIG. 1g illustrates phase shift photomask 17 according to this conventional approach, for the example of the structure of FIGS. 1a and 1b. As shown in FIG. 1g, photomask 17 includes chrome regions 16g, 16c, that mask the locations at which gate electrode 6g and conductor 6c are to be formed. Apertures 18 in photomask 17, however, have one of four possible phase shifts, and are arranged so as to provide phase cancellation at the critical dimension of gate electrode 6g, while permitting exposure of the end of gate electrode 6g that extends toward conductor 6c (FIG. 1a). In the example of FIG. 1g, apertures $18_0$, $18_{180}$ are on opposing sides of chrome region 16g, and transmit opposite phase light relative to one another. On the end of chrome region 16g toward chrome region 16c, however, photomask 17 includes adjacent apertures $18_{60}$, $18_{120}$, which transmit light at 60° and 120° phase angles relative to the light transmitted through aperture $18_0$. Aperture $18_{60}$ is disposed between apertures $18_0$ and $18_{120}$, and aperture $18120$ is disposed between apertures $18_{60}$ and $18_{180}$, as shown in FIG. 1g. While this gradation of phase shift through apertures 18 provides adequate exposure, in many cases, for structures such as that shown in FIGS. 1a and 1b, such multiple phase photomasks are extremely expensive to fabricate, are not conducive to automated photomask generation, and also present significant difficulty to focusing of the exposure in the photolithography process.

BRIEF SUMMARY OF THE INVENTION

It is therefore an object of the present invention to provide a photolithography method in which critical dimension features may be fabricated in close proximity to other features, while providing adequate exposure therebetween.

It is a further object of the present invention to provide such a photolithography method which utilizes a pair of photomasks for the exposure.

It is a further object of the present invention to provide such a photolithography method which does not require more than opposite phase apertures.

It is a further object of the present invention to provide such a photolithography method in which the fabrication of small features is improved.

Other objects and advantages of the present invention will be apparent to those of ordinary skill in the art having reference to the following specification together with its drawings.

The present invention may be implemented in a two-photomask system for exposing photoresist in the photolithography of a single functional level in an integrated circuit. One photomask serves as the binary photomask, and includes masking structures that mask the exposure of non-critical dimension features, as well as protecting critical dimension features from exposure. The phase shift photomask includes opposite phase apertures for the exposure of critical dimension features. Additionally, the phase shift photomask includes additional, non-phase-shift, apertures corresponding to locations at which inadequate exposure is possible, such as at locations between adjacent structures.

DETAILED DESCRIPTION OF THE INVENTION

As will be apparent to those of ordinary skill in the art having reference to this specification, the present invention may be realized by way of the construction of photomasks for use in the fabrication of integrated circuits, and the use of such photomasks in such fabrication. As is well known in the art and as discussed above, photomasks in the field of integrated circuit manufacture appear in many different forms, including "1×" photomasks on which the mask features are the same size as the features to be imaged on the integrated circuit wafers, and also reticles which typically have features that are some multiple (e.g., 4×) of the size of the features to be imaged on the wafer, thus requiring a lens system to focus the exposure onto the wafer. Furthermore, modern photolithography is typically carried out by way of steppers, where each integrated circuit die (or small array of die) on a wafer is separately imaged, and the wafer is "stepped" or indexed (relative to the photomask or reticle) to the next die position on the wafer for imaging of the next die or array of die. Of course, particularly for smaller wafer sizes or for less than minimum geometries, the photomask may image the entire wafer surface with a single exposure. It is contemplated that the present invention may be realized with benefit in each of these applications. Accordingly, for purposes of the following description, the term "photomask" is intended to refer to each and all of these realizations.

As is fundamental in photolithography, photomasks are used to selectively expose portions of a photosensitive film, typically photoresist, that is in place at the surface of an integrated circuit wafer. As is known in the art, photoresists may be of the positive or negative type. By way of definition, the term negative photoresist refers to photoresist material that polymerizes upon exposure and development, with the unexposed regions of photoresist being removed from the wafer, while positive photoresist refers to photoresist that, when exposed and developed, is selectively removable from the wafer with the unexposed regions of photoresist remaining thereupon. It is contemplated that the present invention may be used in the exposure and imaging of either type of resist. However, the present invention is contemplated to be particularly beneficial when applied to the photolithography of positive photoresist, as will be evident from the following description.

Figure 1A:
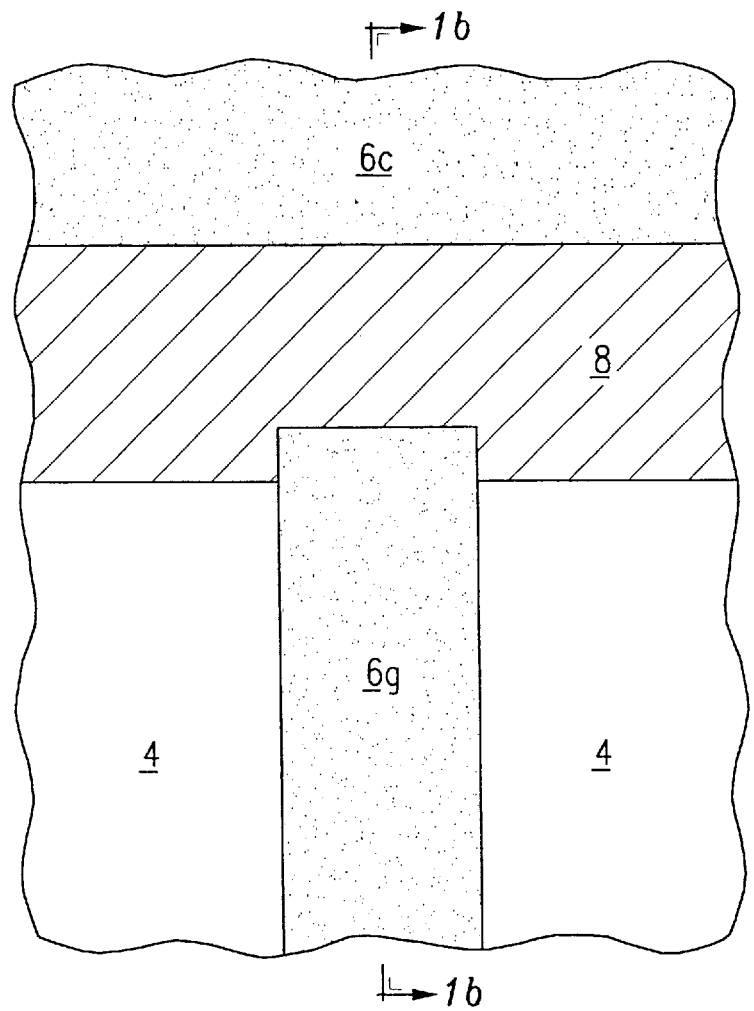
FIGS. 1a and 1b are plan and cross-sectional views, respectively, of a portion of an exemplary integrated circuit structure, at the polysilicon gate level, to be formed by way of photolithography.
Figure 1B:
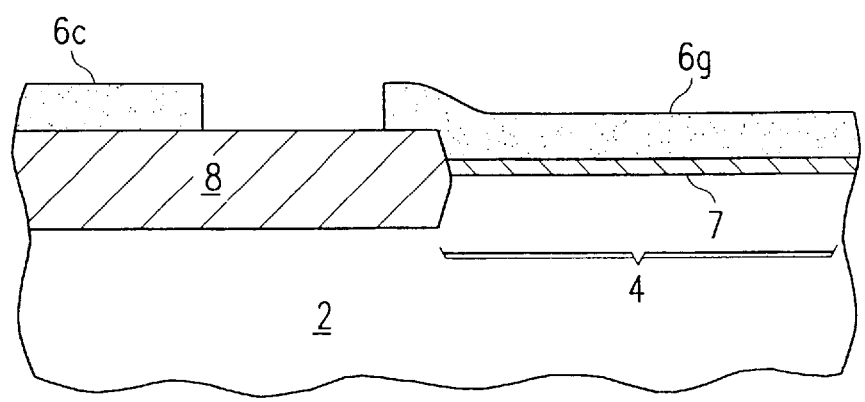
Figure 1D:
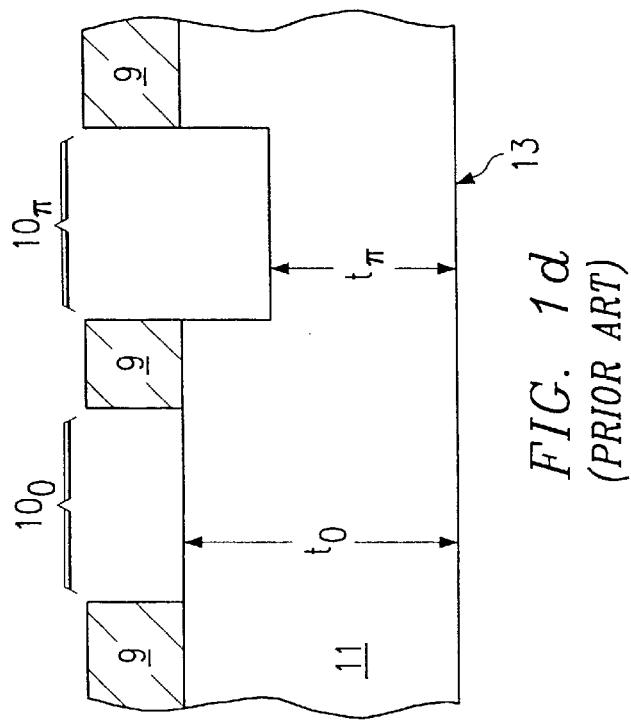
FIGS. 1c and 1d are plan and cross-sectional views, respectively, of a portion of a phase shift photomask used in the photolithography of the structure of FIGS. 1a and 1b, according to a conventional technique.
Figure 1C:
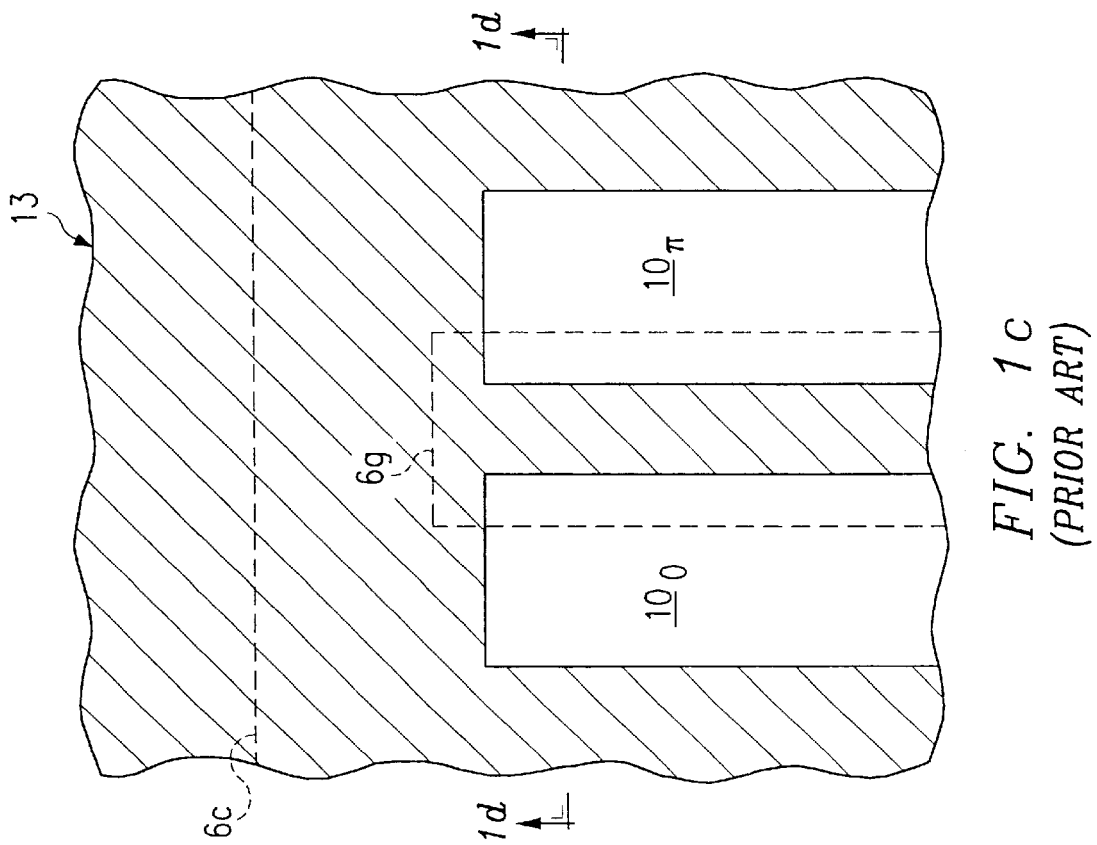
Figure 1G:
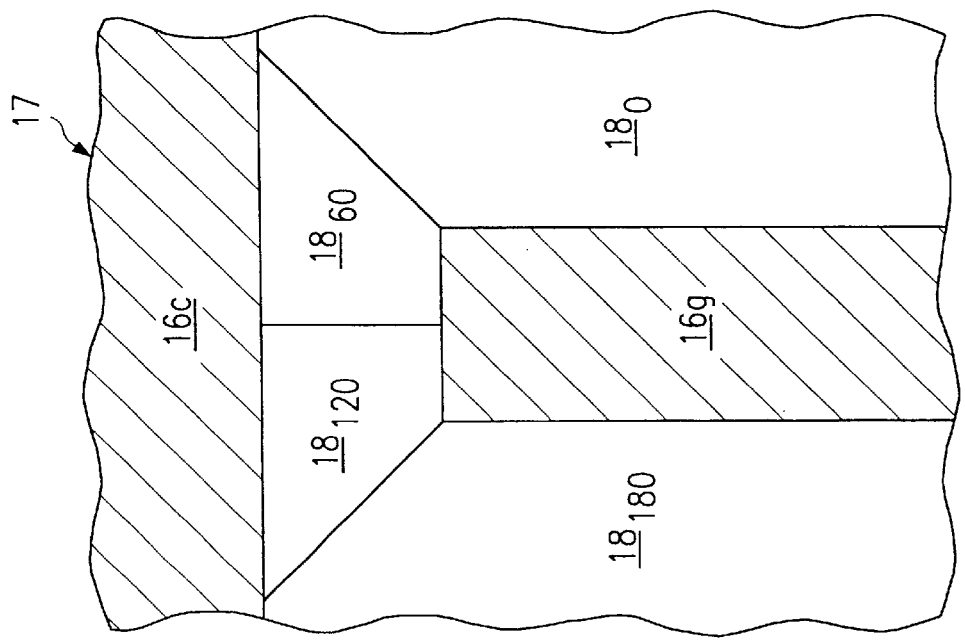
FIG. 1g is a plan view of a portion of a phase shift photomask used in the photolithography of the structure of FIGS. 1a and 1b, according to another conventional technique.
Figure 1E:
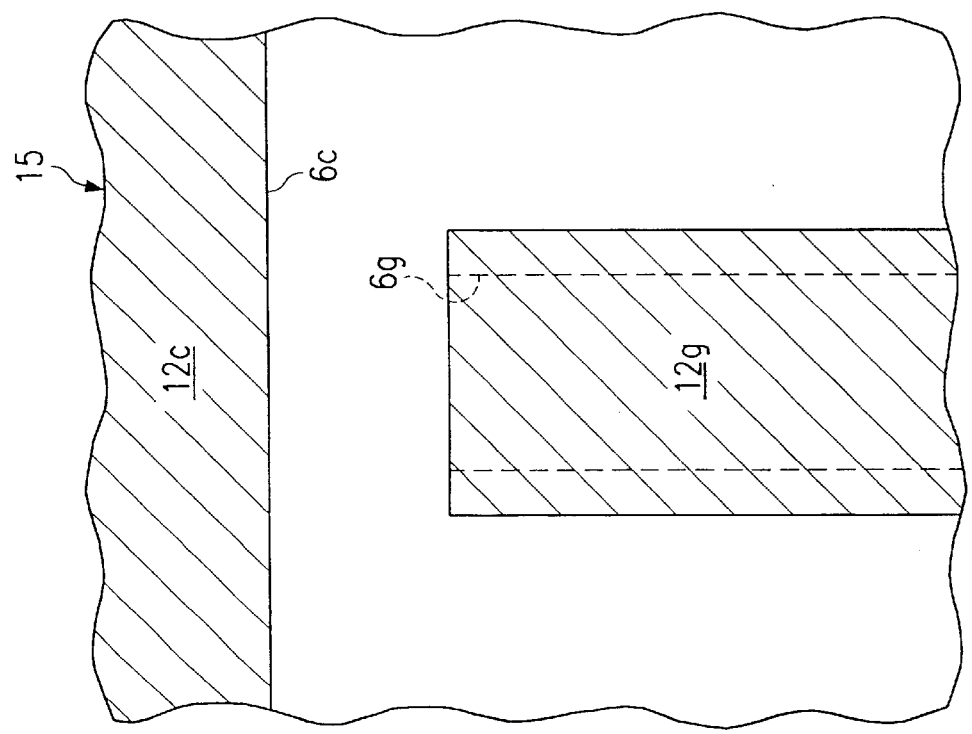
FIG. 1e is a plan view of a portion of a binary photomask used in the photolithography of the structure of FIGS. 1a and 1b, according to a conventional technique.
Figure 2B:
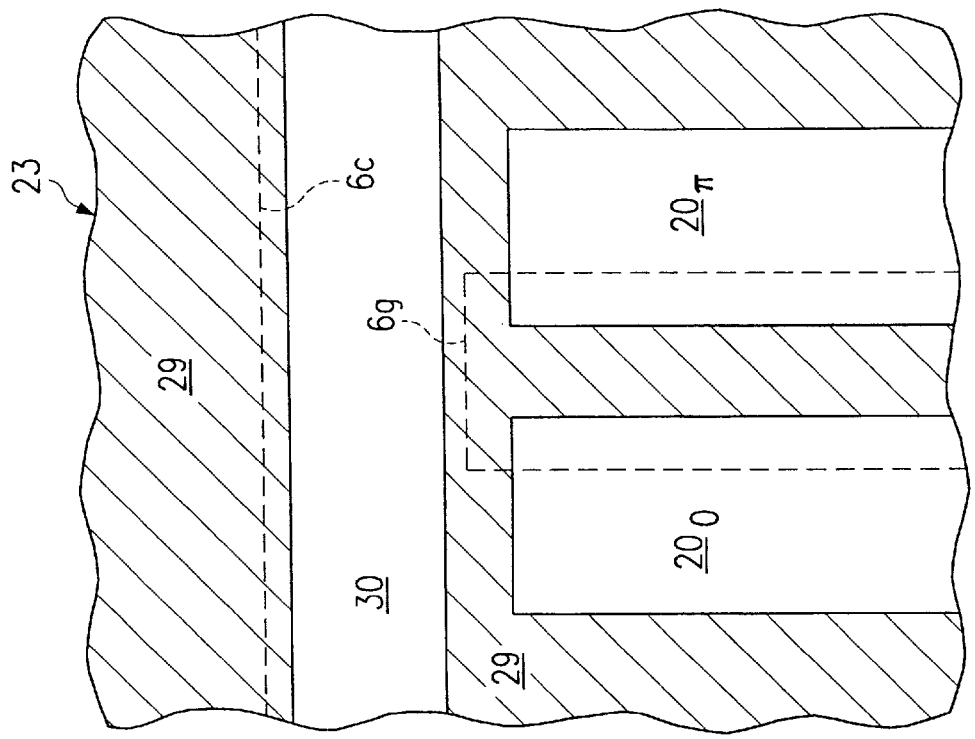
FIG. 2b is a plan view of a portion of a phase shift photomask used in the photolithography of the structure of FIGS. 1a and 1b, according to the first preferred embodiment of the present invention.
Figure 2A:
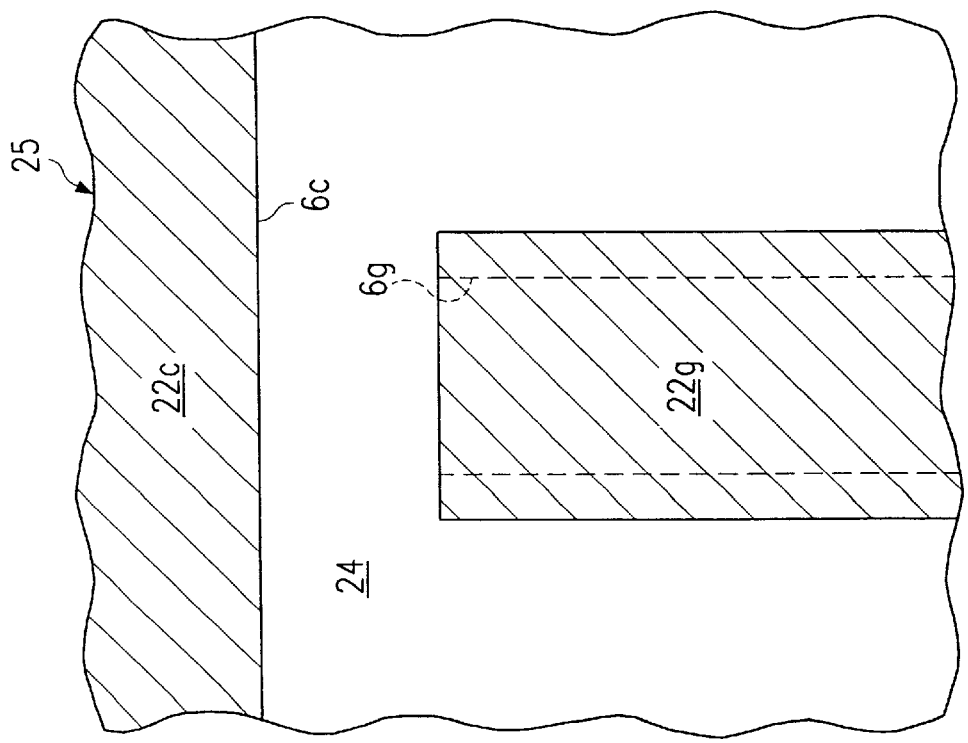
FIG. 2a is a plan view of a portion of a binary photomask used in the photolithography of the structure of FIGS. 1a and 1b, according to a first preferred embodiment of the present invention.

Referring now to FIGS. 2a and 2b, a photomask arrangement according to a first preferred embodiment of the present invention will now be described in detail. The photolithography and corresponding photomasks according to this first preferred embodiment of the invention are intended for the formation of an elongated conductor of an integrated circuit of minimum feature size, or critical dimension. By way of example, photomasks 25, 23 (portions of which are shown in FIGS. 2a and 2b, respectively) according to this first preferred embodiment of the invention will be described relative to the photolithographic fabrication of polysilicon gate electrode 6g near polysilicon conductor 6c in the structure illustrated in FIGS. 1a and 1b described hereinabove. Of course, it is contemplated that the first preferred embodiment of the invention may be used in connection with the photolithography of other films, such as metallization layers, silicide films, and the like. Additionally, as will become apparent from the following description, photomasks 23, 25 according to this first preferred embodiment of the present invention are to be used in connection with positive photoresist.

FIG. 2a illustrates a portion of binary photomask 25 according to this first preferred embodiment of the invention. Binary photomask 25 is constructed in the conventional manner to have a quartz substrate, upon which a chrome film is deposited and patterned (for example, by way of photolithography) to define its transparent and opaque (i.e., masking) regions. In this embodiment of the present invention, in the portion of binary photomask 25 illustrated in FIG. 2a, chrome regions 22g, 22c are provided to block the photo-exposure of photoresist at the locations of gate electrode 6g and conductor 6c, with aperture 24 referring to the transparent portion of binary photomask 25 between and around chrome regions 22g, 22c. According to this first preferred embodiment of the invention, the phase of light transmitted through aperture 24 is not important, and as such aperture 24 may be formed simply by the removal of chrome at its location (i.e., a recess or trench, to effect a particular phase shift, is not required for aperture 24).

Considering that gate electrode 6g will be defined by way of phase shift photomask 23 (described below), chrome region 22g extends somewhat beyond the lateral boundaries of the location at which gate electrode 6g is to be formed. In this manner, chrome region 22g as a gate protective mask, ensuring that gate electrode 6g is formed only by the exposure through phase shift photomask 23, and need not be formed as a critical dimension feature. Chrome region 22c, on the other hand, defines the location of conductor 6c, and as such is defined to the desired dimensions and location of this feature. In this regard, and considering that photomasks 23, 25 according to this example are used in connection with positive photoresist, binary photomask 25 may be referred to as a "bright field" or "light field" photomask.

FIG. 2b illustrates a corresponding portion of phase shift photomask 23 according to this first preferred embodiment of the present invention. Phase shift photomask 23 is fabricated in similar fashion as described above relative to binary photomask 25, by way of patterned chrome film disposed upon a quartz substrate; in addition, however, certain of the apertures in phase shift photomask 23 are formed by way of recesses or trenches etched into the quartz substrate in order to provide opposing phase relationships, as will be described below. In this regard, as illustrated in FIG. 2b, phase shift photomask 23 includes apertures $20_0$, $20_\pi$ through chrome film 29 at locations along opposite sides of the location at which gate electrode 6g is to be formed. Apertures $20_0$, $20_\pi$ are formed in phase shift photomask 23 so that the light transmitted by aperture $20_\pi$ will have a 180° ($\pi$ radians) phase shift relative to the light transmitted by aperture $20_0$. Of course, while exactly a 180° phase shift is preferable in order to provide the optimum cancellation effects, some amount of error is tolerable in the actual phase shift that is produced.

As described above, light at a particular wavelength is substantially locally coherent when transmitted through photomask apertures of a size that is on the same order as the wavelength itself. The phase of the transmitted light depends upon the thickness of the transparent substrate traversed by the transmitted light. In this regard, apertures $20_0$, $20_\pi$ of phase shift photomask 23 according to this first preferred embodiment of the invention transmit light of opposite phase relative to one another, so that the critical dimension of the width of gate electrode 6g may be precisely defined by well-known phase cancellation effect.

As is known in the art, diffraction effects cause the photoexposure through a mask to not precisely align with the edges of opaque features of the photomask. As the feature being patterned becomes very small, for example in the case of a very small opaque feature of a photomask defining a region, such as a gate electrode, that is not to be exposed in photolithography, diffracted light from opposite sides of the opaque photomask may overlap at the photoresist location beneath the opaque mask feature. In this event, the desired feature may not be imaged in the photoresist. Phase shift photolithography, for example as implemented by phase shift photomask 23 in this embodiment of the invention, provides opposite phase apertures on opposite sides of the opaque chrome region, so that overlapping diffracted light cancels out.

Referring back to FIG. 2b, this phase cancellation effect occurs because the opposite phase light transmitted through apertures $20_0$, $20_\pi$ relative to one another cancels out at locations between apertures $20_0$, $20_\pi$, rendering the photoresist unexposed. As described above relative to conventional phase shift masks, in order to cause the light transmitted through apertures $20_0$, $20_\pi$ to be of opposite phase relative to one another, apertures $20_0$, $20_\pi$ are realized not only by the absence of chrome film 29 thereat, but also differences in the thickness of the underlying substrate at the aperture locations. Conventionally, phase shift mask apertures such as apertures $20_0$, $20_\pi$ are formed by etching trenches into the quartz substrate 5 at one or both of apertures $20_0$, $20_\pi$ so that the remaining thicknesses of the substrate at apertures $20_0$, $20_\pi$ differ from one another. As discussed above, the relationship between the substrate thicknesses depends upon the wavelength of the light to be used in the exposure. According to known theory, the differential thickness, or trench depth, to provide a full 180° phase shift for light of wavelength $\lambda$ is $(2N+1)\lambda/2n$ with N an integer (0, 1, 2, . . . ) and n the index of refraction of the mask substrate, which is 1.45 for quartz. For example, if the light used to expose photoresist through photomask 23 has a wavelength of 248 nm, differential trench depth values of 85.5 nm, 256.5 nm, 427.5 nm, . . . , between adjacent apertures $20_0$, $20_\pi$ would provide the opposite phase effect.

According to this first preferred embodiment of the invention, phase shift photomask 23 includes additional aperture 30 through chrome film 29. Aperture 30 is disposed at a location between the eventual end of gate electrode 6g and the eventual location of polysilicon conductor 6c. With reference to FIG. 1a, aperture 30 is disposed over field oxide structure 8; this location of an aperture in a phase shift photomask is contrary to the arrangement of conventional phase shift photomasks, in which apertures are limited to active region locations. In this preferred embodiment of the invention, aperture 30 is preferably formed to have a width so as not to overlap onto either of the intended locations of gate electrode 6g and conductor 6c. The particular precision of the spacing of aperture 30 from these intended feature edges is not particularly critical, however. Also according to this first preferred embodiment of the invention, the phase shift applied by aperture 30 to light transmitted therethrough is of no importance; as such, aperture 30 may be formed, in this example, as either a zero phase shift aperture or a 180° phase shift aperture. For ease of manufacture, aperture 30 may be formed on photomask 23 by simply etching an aperture through chrome film 29, without formation of a recess into the mask substrate.

In the use of photomasks 23, 25 according to the present invention in the photolithography process, an integrated circuit wafer having a polysilicon layer deposited thereupon is coated with a positive photoresist. The coated wafer is then exposed twice, in the photolithography process for this level of polysilicon. One exposure is made through binary photomask 25, and the second through phase shift photomask 23. The order in which these two exposures is carried out is not important, as there is not believed to be any dependence of the resulting exposure of the photoresist upon the order in which photomasks 23, 25 are used. Following both exposures, the photoresist is developed. Polysilicon etch is then carried out, by way of a wet etch or a plasma etch (plasma etch being preferably for the critical dimension gate etch), using the remaining unexposed portions of the photoresist layer as a mask to the etch. Following the etch, the photoresist mask is removed, and the wafer continues through the manufacturing process.

The effect of aperture 30 in the formation of gate electrode 6g and conductor 6c, particularly in consideration of the edge of field oxide structure 8 therebetween (see FIGS. 1a and 1b), is to provide additional exposure to the photoresist at this location. As discussed above relative to FIG. 1f, the combination of the phase cancellation effects and the close proximity of the two polysilicon elements (the end of critical dimension gate electrode 6g and non-critical dimension conductor 6c) can result in the underexposure of the photoresist between these elements, and in the resulting bridging of polysilicon in this location. Aperture 30 provides additional exposure to this otherwise underexposed location, thus ensuring full exposure and eliminating the possibility of bridging thereat.

Figure 1F:
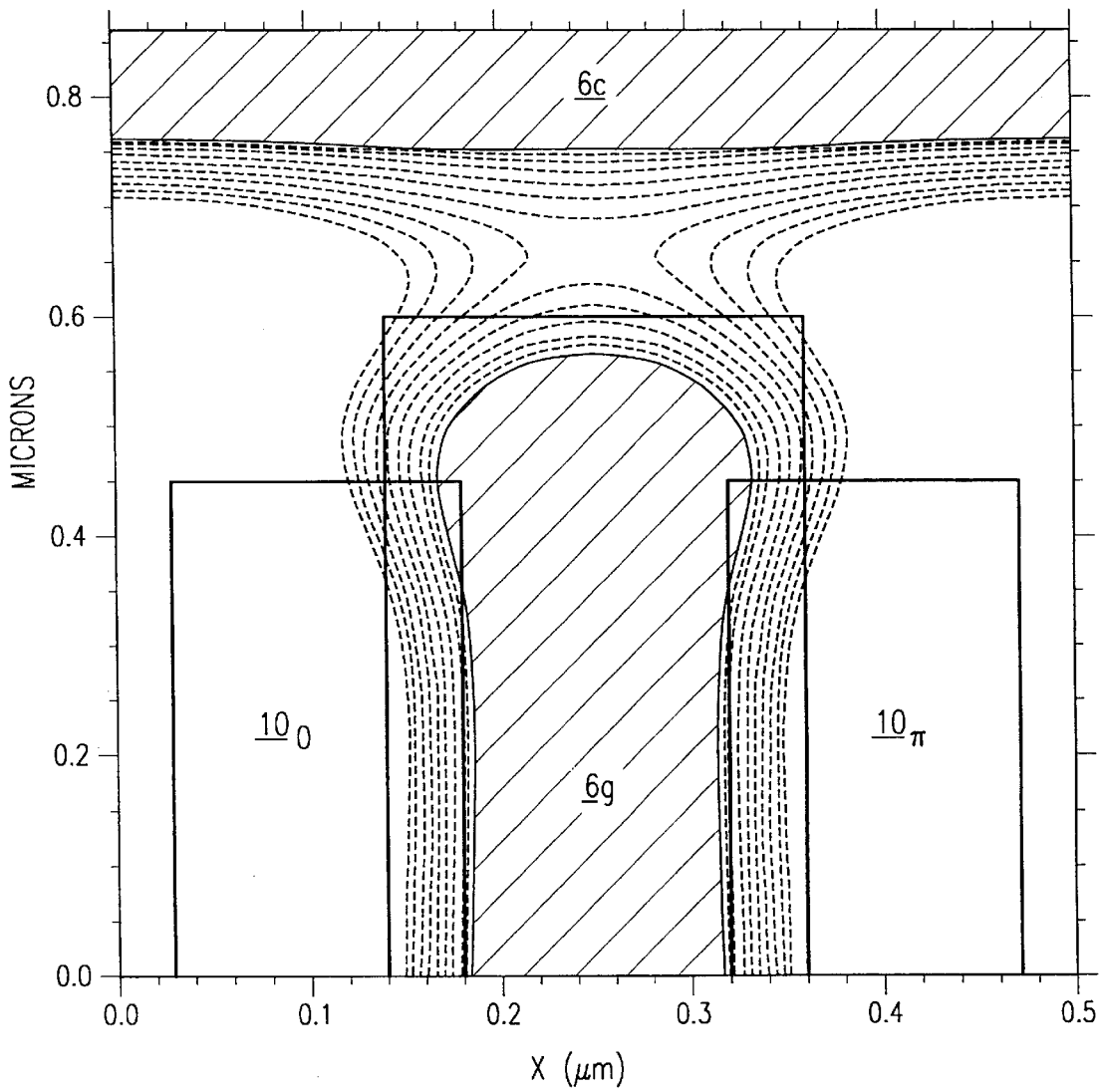
FIG. 1f is a simulation plot of exposure according to conventional photolithography using the photomasks of FIGS. 1c through 1e.
Figure 2C:
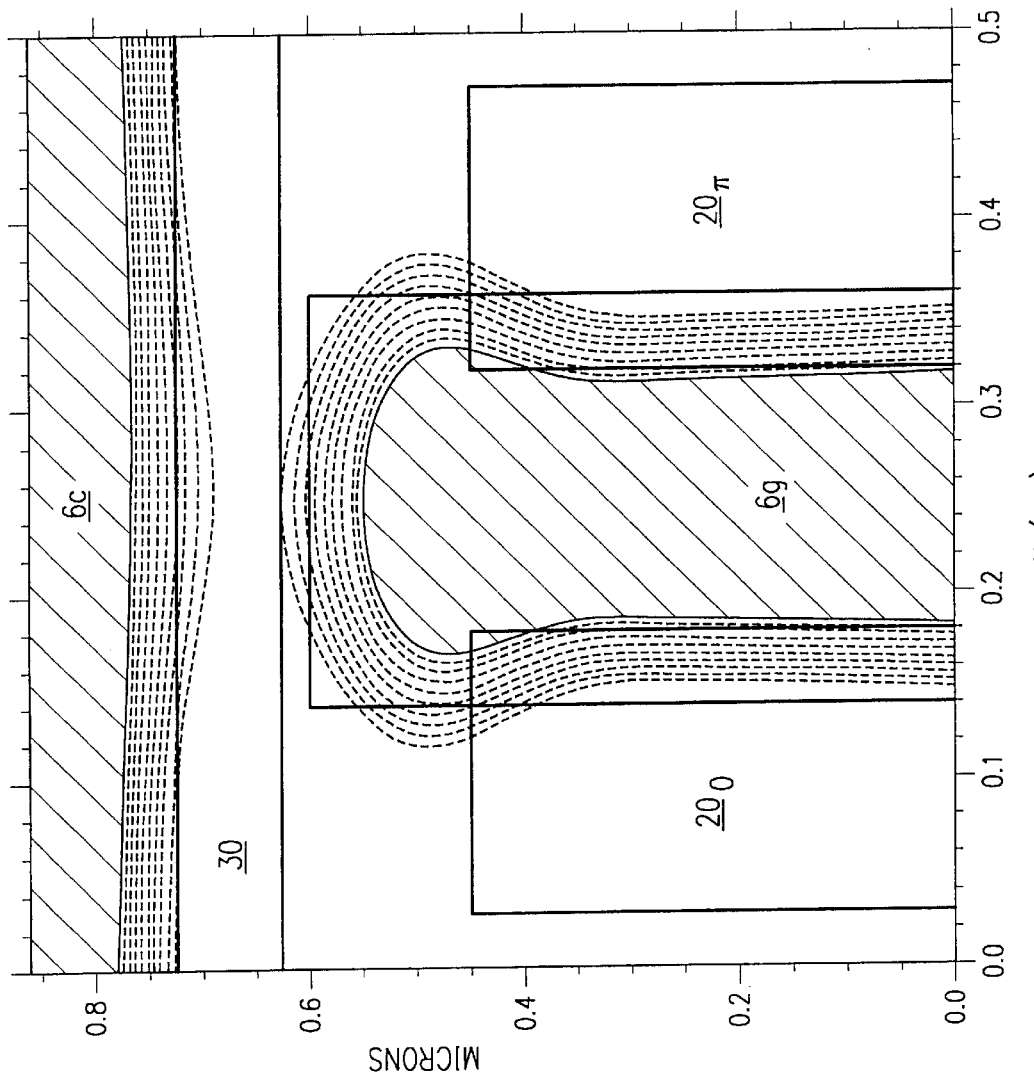
FIG. 2c is a simulation plot of exposure according to photolithography using the photomasks of FIGS. 2a and 2b according to the first preferred embodiment of the present invention.

FIG. 2c illustrates the results of an exposure simulation for the portions of photomasks 23, 25 used to fabricate gate electrode 6g and conductor 6c in the structure of FIGS. 1a and 1b. In this plot, regions that receive no exposure, such as at the locations of gate electrode 6g and conductor 6c, are cross-hatched, while locations receiving full exposure, such as generally within the locations of apertures $20_0$, $20_\pi$, are blank. The contour lines connect points receiving common exposure levels, at 10% increments between full exposure and no exposure. FIG. 2c also illustrates the location of aperture 30 in this simulation.

As shown in FIG. 2c, as a result of the incorporation of aperture 30 into phase shift photomask 23 according to this first preferred embodiment of the invention, the region between the end of gate electrode 6g and conductor 6c now receives full exposure over a large part of its width. Comparison of the simulation of FIG. 2c with that illustrated in FIG. 1f according to conventional two-mask phase shift photolithography shows significant improvement in the exposure of this critical region. As a result of the present invention, therefore, the risk of inadequate exposure resulting in bridging of the patterned film, such as polysilicon in this example, is greatly reduced if not fully eliminated.

This important benefit of the present invention is obtained at effectively no cost in either the manufacturing of the photomasks or of the integrated circuit wafers themselves. Additional aperture 30 in phase shift photomask 23 in this embodiment of the invention may be formed at effectively no cost, especially considering that its phase shift effect is not relevant to the operation of the invention (and thus no trench or recess need be formed thereat). Furthermore, considering that two exposures are being used to pattern the critical dimension gate electrode 6g in this polysilicon layer, the inclusion of aperture 30 in phase shift photomask 23 does not add to the manufacturing cost of the wafer in any way. As such, the present invention provides improved patterning at minimal incremental cost over conventional two-mask photolithography.

It is contemplated that the automated generation of photomasks to include additional apertures according to the present invention may be readily performed. For example, the photomask generation program can readily identify wafer locations that have a spacing below a certain threshold value, in a particular level for which two-mask exposure using binary and phase shift masks is to be performed. At these identified locations, the photomask generation program can then insert an aperture in the phase shift photomask; for ease of manufacture, this additional aperture may simply be made to have the same phase as the nearest phase shift aperture.

The present invention may also be used to benefit in the fabrication of other structures, particularly those that are relatively small features, whether isolated or interspersed among other unrelated features. An example of the photolithographic fabrication of a "post" feature, for example of polysilicon, according to a second preferred embodiment of the present invention will now be described relative to FIGS. 3a and 3b. In this regard, it is contemplated that the example of the application of the second preferred embodiment of the invention as illustrated relative to FIGS. 3a and 3b will be carried out at another location of the wafer utilizing a double exposure phase shift masking, for example as described above relative to FIGS. 2a through 2c or even in combination with conventional techniques, in which a two-mask photolithographic operation is already being carried out.

Figure 3A:
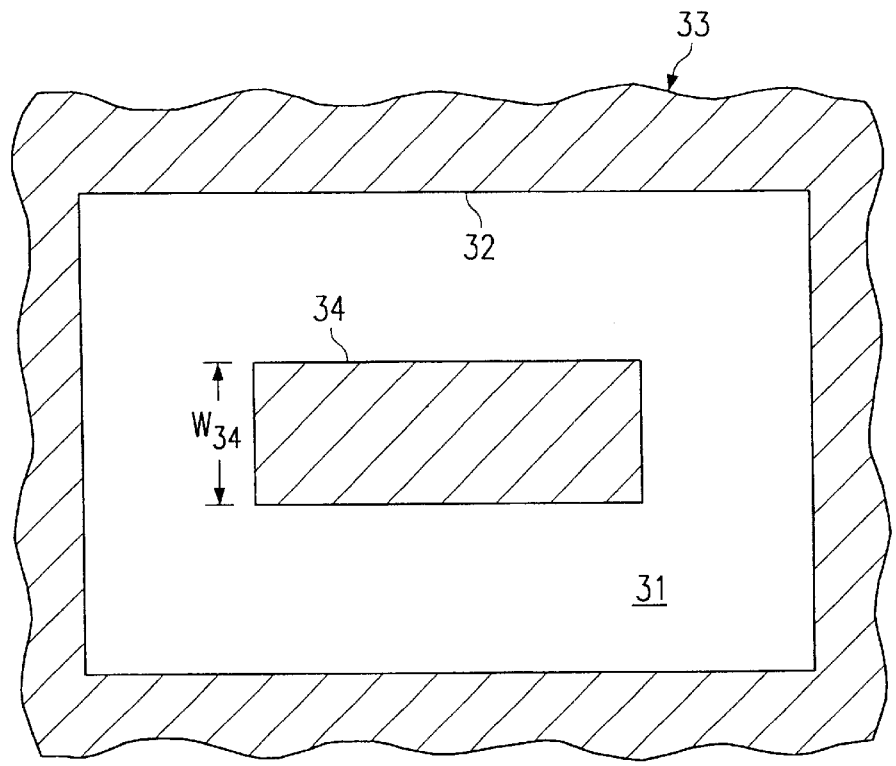
FIGS. 3a and 3b are plan views of a portion of photomasks used in the photolithography of the structure of FIGS. 1a and 1b, according to a second preferred embodiment of the present invention.

FIG. 3a illustrates a portion of dark field photomask 33 for forming a polysilicon post at a relatively isolated location of a semiconductor wafer. Such a polysilicon post feature may be useful for making interlevel connections between an overlying conductor and a lower conductive region, for example a lower polysilicon level or an active region of the underlying substrate. Because of its "dark field" characteristics, it is contemplated that photomask 33 will correspond to a phase shift photomask such as phase shift photomask 23 described above, but where the phase shift masking is carried out at a location separate from that shown in FIG. 3a. As shown in FIG. 3a, photomask 33 includes a chrome field 32, within which aperture 31 is formed so as to leave chrome field 34 near its center. The phase characteristics of aperture 31 are not important. Chrome field 34 is arranged to be substantially rectangular, with one dimension somewhat longer than the other, as shown in FIG. 3a. For this example, it is contemplated that the width $w_{34}$ of chrome field 34 is a minimum dimension for dark field photomask 33, for example being on the same order of magnitude as a polysilicon transistor gate electrode width in the integrated circuit.

Figure 3B:
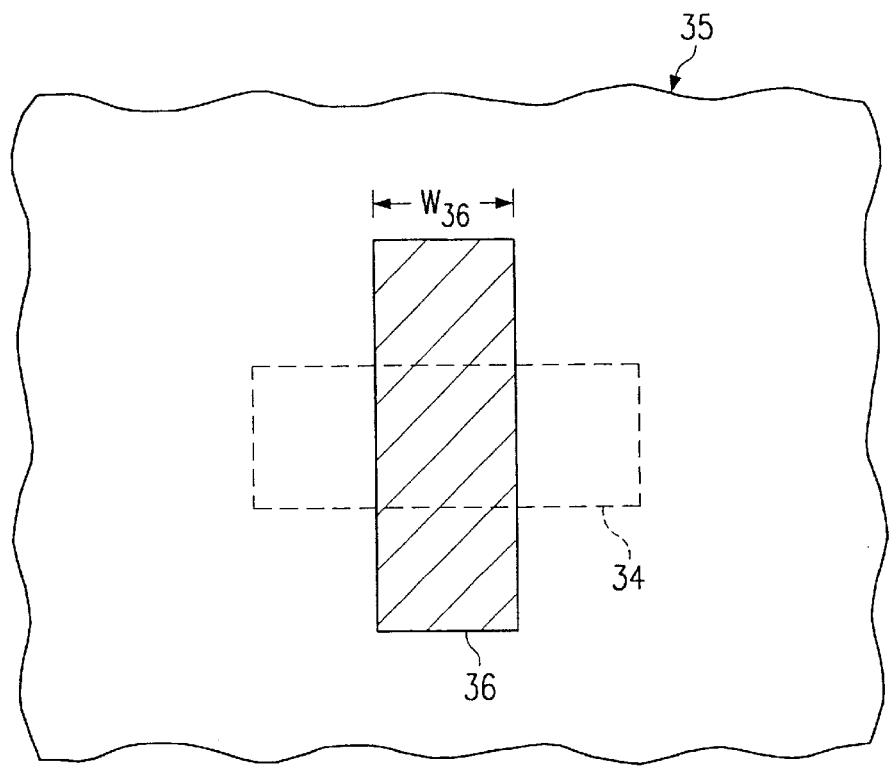

FIG. 3b illustrates the same location of bright field photomask 35 corresponding to dark field photomask 33 of FIG. 3a. Bright field photomask 35 corresponds to binary photomask 25 described hereinabove, which defines the outline of non-critical dimension features in the integrated circuit, and as such is contemplated to not include phase shift masking features. As shown in FIG. 3b, bright field photomask 35 has chrome field 36 for masking a portion of the photoresist corresponding to the post feature to be formed. As in the case of chrome field 34, chrome field 36 has one dimension that is substantially longer than the other, with the smaller dimension (width $w_{36}$) being on the order of the minimum dimension of the level being patterned. The orientation of chrome field 36 is perpendicular to that of chrome field 34, but concentric with the location of chrome field 34, as indicated by the dashed-line shadow of chrome field 34 in FIG. 3b. In use, dark field photomask 33 and bright field photomask 35 are used in the double-exposure of a photoresist film dispensed over a conductive layer, such as polysilicon, that is in place at a surface of a semiconductor wafer and that is to be etched according to a desired pattern. In this double-exposure, each of photomasks 33, 35 are of course aligned and registered with the wafer in the appropriate manner to form the integrated circuit. Such alignment should align photomasks 33, 35 with one another, in their separate exposures, in the manner indicated in FIGS. 2a and 2b. For example, chrome region 22g of binary photomask 35 is to cover the opaque spacer between openings $20_0$, $20_\pi$ of phase shift photomask 33. As before, the order in which the photoresist layer is exposed through photomasks 33, 35 is not important. It is also preferred, as noted above, that dark field photomask 33 include phase shift apertures elsewhere in the integrated circuit, considering that two exposures are being made anyway; preferably, dark field photomask 33 includes additional apertures, such as aperture 30, at potential bridging locations, as described hereinabove relative to the first preferred embodiment of the invention. As a result of the double exposure of photoresist through photomasks 33, 35, an unexposed portion of photoresist will be present at the location corresponding to the intersection of chrome field 34 and chrome field 36. This unexposed portion of the photoresist will remain after developing, serving as a mask during the etch of the underlying layer. A post of this layer will be formed accordingly.

Figure 3C:
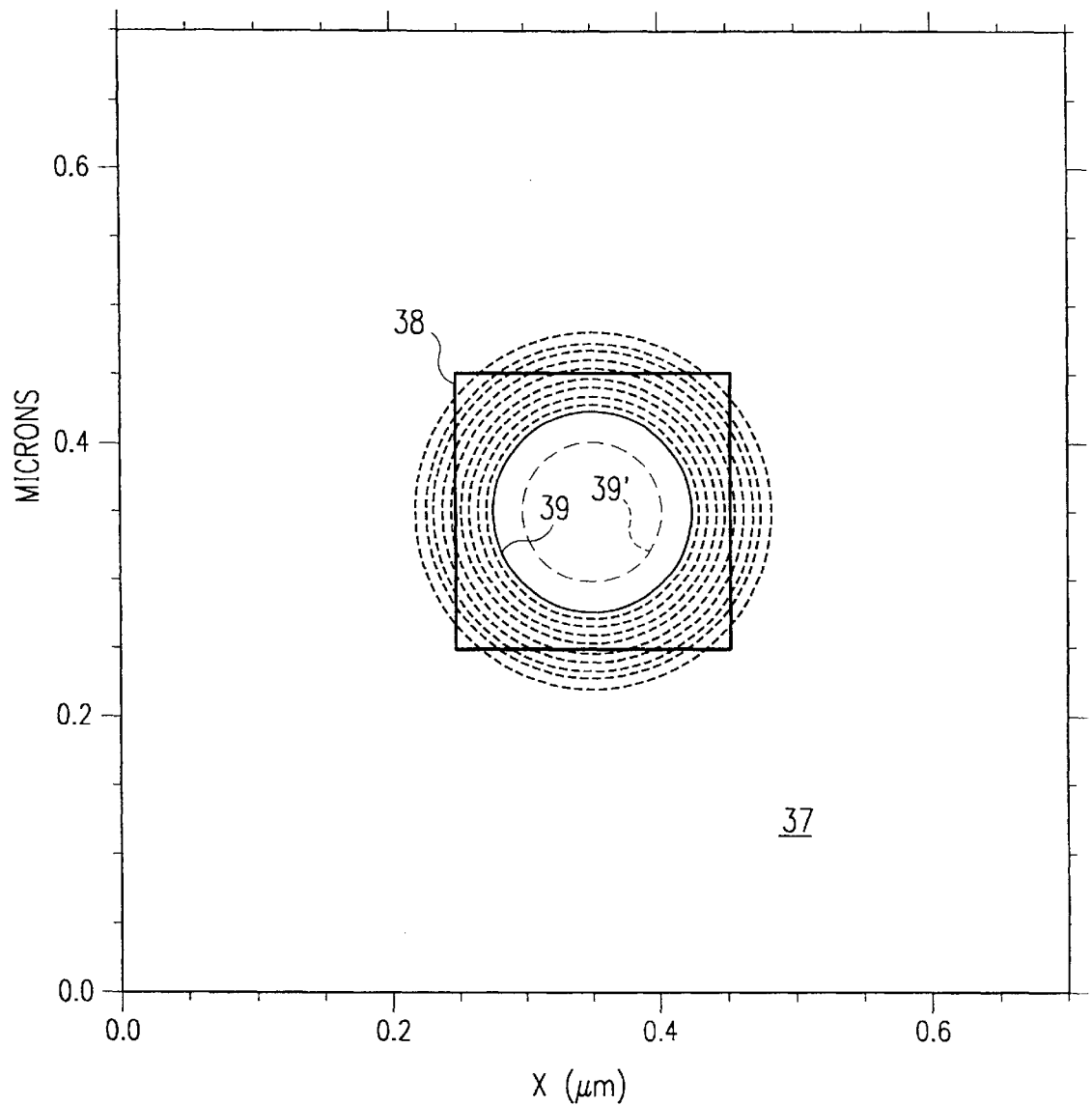
FIG. 3c is a simulation plot of exposure according to photolithography using the photomasks of FIGS. 3a and 3b according to the second preferred embodiment of the present invention.

FIG. 3c illustrates the results of an exposure simulation relative to the double exposure of a photoresist layer through photomasks 33, 35, where boundary 38 corresponds to the intersection of chrome regions 34, 36, and for the example where critical dimension widths $w_{34}$ and $w_{36}$ are each $0.2\mu$. In this simulation, exposure levels range from full exposure in region 37 surrounding boundary 38, to no exposure at the center of boundary 38 (no cross-hatching being present in FIG. 3c, for purposes of clarity). Contour lines in FIG. 3c connect points of equal exposure, at 10% intervals from full exposure to no exposure, where contour line 39 corresponds to the boundary of no exposure. By way of comparison, contour line 39' is shown in FIG. 3c to indicate the no exposure boundary from simulation of a single exposure using a square chrome masking element of dimensions equal to the intersection of chrome regions 34, 36 (i.e., corresponding to boundary 38).

As is readily apparent from FIG. 3c, the formation of a photoresist feature, and thus a resulting underlying integrated circuit feature, using a double exposure approach according to this second embodiment of the present invention is improved by the use of perpendicular chrome regions on the two photomasks. This improvement results from the use of the chrome regions of the two masks, angled relative to one another (in this case substantially perpendicularly), preventing the overexposure that occurs from the single masking element. As a result, minimum feature size mask elements may be used to form isolated features of reliable construction, without requiring oversizing of the mask elements.

It is contemplated that additional alternative embodiments of the present invention will also become apparent to those of ordinary skill in the art having reference to this specification, while still obtaining the benefits of the present invention. In this regard, it is contemplated that the benefits provided from use of the second exposure phase shift mask for the patterning of binary elements according to the present invention, such as described hereinabove, can be applied in many circumstances in the manufacture of modern integrated circuits.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A set of photomasks for photolithographic patterning of a layer of an integrated circuit, comprising:
    a binary photomask having at least two spaced apart opaque regions at a surface thereof defining a first aperture therebetween;
    a phase shift photomask having an opaque film at a surface thereof in which a plurality of apertures are formed, the plurality of apertures including first and second phase shift apertures separated from one another on the photomask by a first opaque region of the opaque film, the first and second phase shift apertures constructed to transmit electromagnetic energy therethrough at substantially opposite phases relative to one another, the plurality of apertures also including a third aperture in the opaque film separated from the first and second phase shift apertures and positioned to overlap a portion of said first aperture of said binary photomask.

2. The set of photomasks of claim 1, the plurality of opaque regions of the binary photomask also including a third opaque region, having a rectangular shape with a first dimension longer than a second dimension, the plurality of apertures of the phase shift mask also defining a second opaque region having a rectangular shape with a first dimension longer than a second dimension and the intersection of the third opaque region of the binary photomask and the second opaque region of the phase shift mask defining a third integrated circuit location, the third opaque region of the binary photomask and the second opaque region of the phase shift mask being aligned orthogonal to one another so that the third integrated circuit location has a size defined by the second dimension of each of the third opaque region of the binary photomask and the second opaque region of the phase shift mask.

3. The set of claim 1 wherein said spaced apart opaque regions of said binary mask define interconnect and gate regions of a semiconductor device.

4. The set of claim 1 wherein said first opaque region of said phase shift photomask defines at least a portion of a gate of a semiconductor device.

5. The set of claim 4 wherein said first opaque region of said phase shift photomask defines at least a portion of a gate of a semiconductor device.

6. The set of claim 2 wherein said spaced apart opaque regions of said binary mask define interconnect and gate regions of a semiconductor device.

7. The set of claim 2 wherein said first opaque region of said phase shift photomask defines at least a portion of a gate of a semiconductor device.

8. The set of claim 7 wherein said first opaque region of said phase shift photomask defines at least a portion of a gate of a semiconductor device.

* * * * *